United States Patent
Lin

(10) Patent No.: US 11,404,192 B2
(45) Date of Patent: Aug. 2, 2022

(54) SUPPORT STRUCTURE FOR SUPPORTING FLEXIBLE DISPLAY SCREEN, AND FLEXIBLE DISPLAY SCREEN MODULE

(71) Applicant: GUANGDONG OPPO MOBILE TELECOMMUNICATIONS CORP., LTD., Guangdong (CN)

(72) Inventor: Yugui Lin, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 919 days.

(21) Appl. No.: 16/305,043

(22) PCT Filed: Jun. 30, 2017

(86) PCT No.: PCT/CN2017/091270
§ 371 (c)(1),
(2) Date: Nov. 27, 2018

(87) PCT Pub. No.: WO2018/006761
PCT Pub. Date: Jan. 11, 2018

(65) Prior Publication Data
US 2019/0371505 A1    Dec. 5, 2019

(30) Foreign Application Priority Data

Jul. 8, 2016  (CN) .......................... 201610542624.5

(51) Int. Cl.
*H01F 7/20*    (2006.01)
*G06F 1/16*    (2006.01)
(Continued)

(52) U.S. Cl.
CPC ................. *H01F 7/20* (2013.01); *G06F 1/16* (2013.01); *G06F 1/1652* (2013.01); *H01F 7/064* (2013.01);
(Continued)

(58) Field of Classification Search
CPC ........ G06F 1/1652; G06F 1/1637; G06F 1/16; H01F 7/064; H01F 7/20; H01F 7/14;
(Continued)

(56) References Cited

U.S. PATENT DOCUMENTS 9,746,701 B2   8/2017  Sung et al.
9,883,604 B2   1/2018  Lee et al.
(Continued)

FOREIGN PATENT DOCUMENTS

CN   101163163   4/2008
CN   101952873   1/2011
(Continued)

OTHER PUBLICATIONS

EPO, Office Action for EP Application No. 17823573, dated Apr. 29, 2019.
(Continued)

*Primary Examiner* — Mohamad A Musleh
(74) *Attorney, Agent, or Firm* — Hodgson Russ LLP

(57) ABSTRACT

A support structure for supporting a flexible display screen includes: a plurality of electromagnets and a controller electrically coupled to the plurality of electromagnets. Each electromagnet has a first surface and a second surface. The first surface is configured to be attached and secured to a flexible display screen so as to support the flexible display screen, and the second surface is at an acute angle to the first surface. When the flexible display screen is extended, the controller controls two adjacent electromagnets to repel each other. When the flexible display screen is bent, the controller controls two adjacent electromagnets to attract each other.

16 Claims, 9 Drawing Sheets

(51) Int. Cl.
  *H01L 51/52* (2006.01)
  *H01F 7/06* (2006.01)
  *H01F 7/08* (2006.01)
  *H01F 7/129* (2006.01)
  *H01F 7/14* (2006.01)
  *H04B 1/3827* (2015.01)

(52) U.S. Cl.
  CPC ........ *H01L 51/5237* (2013.01); *G06F 1/1637* (2013.01); *H01F 7/081* (2013.01); *H01F 7/129* (2013.01); *H01F 7/14* (2013.01); *H01F 2007/086* (2013.01); *H01L 2251/5338* (2013.01); *H04B 1/3827* (2013.01)

(58) Field of Classification Search
  CPC ........ H01F 7/081; H01F 7/129; H01F 1/5237; H01F 2007/086; H04M 1/0268; H01L 2251/5338; H04B 1/3827; G02F 1/133305; G02F 2203/04102; G09F 9/301
  See application file for complete search history.

(56) References Cited

U.S. PATENT DOCUMENTS

| | | | |
|---|---|---|---|
| 10,485,100 | B2 | 11/2019 | Senda et al. |
| 10,488,886 | B2 | 11/2019 | Browne et al. |
| 2010/0265668 | A1 | 10/2010 | Yuen et al. |
| 2013/0190052 | A1 | 7/2013 | Lundell |
| 2014/0118910 | A1 | 5/2014 | Sung et al. |
| 2014/0321073 | A1* | 10/2014 | Hong ............... G06F 1/1652 335/289 |
| 2015/0145755 | A1* | 5/2015 | Yamazaki ............ G09G 3/32 361/679.01 |
| 2015/0160501 | A1* | 6/2015 | Cope .................. G06F 1/16 345/88 |
| 2017/0092224 | A1 | 3/2017 | Senda et al. |
| 2017/0181304 | A1 | 6/2017 | Lee et al. |
| 2017/0200545 | A1 | 7/2017 | Browne et al. |
| 2017/0208157 | A1* | 7/2017 | Kim .................. H04M 1/0216 |
| 2019/0156980 | A1 | 5/2019 | Lin et al. |
| 2019/0166696 | A1 | 5/2019 | Lin et al. |
| 2019/0287704 | A1 | 9/2019 | Lin et al. |
| 2019/0289721 | A1 | 9/2019 | Lin et al. |

FOREIGN PATENT DOCUMENTS

| | | |
|---|---|---|
| CN | 204045140 | 12/2014 |
| CN | 105491194 | 4/2016 |
| CN | 105492817 | 4/2016 |
| CN | 105518768 | 4/2016 |
| CN | 106131251 | 11/2016 |
| EP | 1912416 | 4/2008 |
| EP | 2912650 | 9/2015 |

OTHER PUBLICATIONS

USPTO, Office Action for U.S. Appl. No. 16/433,501, filed Dec. 12, 2019.
WIPO, ISR for CN Application No. PCT/CN2017/091270, dated Sep. 29, 2017.
SIPO, Office Action for CN Application No. 201610542624, dated Feb. 11, 2018.
IPI, Office Action for IN Application No. 201817046988, dated Nov. 25, 2020.

* cited by examiner

SUPPORT STRUCTURE FOR SUPPORTING FLEXIBLE DISPLAY SCREEN, AND FLEXIBLE DISPLAY SCREEN MODULE

CROSS-REFERENCE TO RELATED APPLICATION

The present application is a national phase entry under 35 U.S.C. § 371 of International Application PCT/CN2017/091270, filed Jun. 30, 2017, which claims priority to Chinese Patent Application No. 201610542624.5, filed Jul. 8, 2016, the entire disclosures of which are incorporated herein by reference.

FIELD

The present disclosure relates to a technical field of electronic devices, and more particularly, to a support structure for supporting a flexible display screen, and a flexible display screen module.

BACKGROUND

With the development of flexible display technology, the flexible display screen is increasingly used in mobile terminals, and a support structure is used to realize collapse or expansion of the flexible display screen. At present, most mobile terminals have two kinds of support structures, namely a support structure of a folding mode, and a support structure of a rolling mode. When the mobile terminal adopts the support structure of the folding mode, the flexible display screen is conveniently supported by a board after being expanded, but it is not easy to reduce the volume after the flexible display screen is folded. When the mobile terminal adopts the support structure of the rolling mode, the flexible display screen can be rolled up with volume shrinkage, but there is no support structure, which is not conducive to supporting the after being expanded. Therefore, there is currently no support structure that can facilitate the volume shrinkage of the flexible display screen and also facilitate the support of the flexible display screen after being expanded.

SUMMARY

Embodiments of the present disclosure provide a support structure for supporting a flexible display screen. The support structure includes a plurality of electromagnets and a controller electrically coupled with the plurality of electromagnets. Each electromagnet has a first surface and a second surface. The first surface is configured to be attached and secured to the flexible display screen so as to support the flexible display screen, and the second surface is at an acute angle to the first surface. When the support structure is expanded, the controller is configured to control second surfaces of two adjacent electromagnets to be mutually repelled; when the support structure is bent, the controller is configured to control second surfaces of two adjacent electromagnets to be mutually attracted.

Embodiments of the present disclosure further provide a flexible display screen module. The flexible display screen module includes a flexible display screen, a flexible panel, a plurality of electromagnets and a controller. The flexible panel has an outer surface and an inner surface arranged oppositely, and the flexible display screen is attached to the outer surface. The plurality of electromagnets are secured to the inner surface, each electromagnet has a side surface, and side surfaces of two adjacent electromagnets defining a clearance therebetween. The controller is electrically coupled with the plurality of electromagnets, when the flexible display screen is expanded, the controller is configured to control side surfaces of two adjacent electromagnets to be mutually repelled; when the flexible display screen is bent, the controller is configured to control side surfaces of two adjacent electromagnets to be mutually attracted.

Embodiments of the present disclosure further provide a flexible display screen module. The flexible display screen module includes a flexible display screen, a plurality of electromagnets, and a controller. The plurality of electromagnets are secured to the flexible display screen, each electromagnet has a first magnetic pole and a second magnetic pole arranged side by side on the flexible display screen. The controller electrically is coupled with the plurality of electromagnets, when the flexible display screen is expanded, the controller is configured to control the first magnetic pole of one electromagnet to approach to the first magnetic pole of another adjacent electromagnet, or to control the second magnetic pole of one electromagnet to approach to the second magnetic pole of another adjacent electromagnet; when the flexible display screen is bent, the controller is configured to control the first magnetic pole of one electromagnet to approach to the second magnetic pole of another adjacent electromagnet, or to control the second magnetic pole of one electromagnet to approach the first magnetic pole of another adjacent electromagnet.

BRIEF DESCRIPTION OF THE DRAWINGS

In order to illustrate technical solutions of the present disclosure more clearly, drawings required in embodiments will be briefly described below. Obviously, the drawings described below only show a part of embodiments of the present disclosure, and based on these drawings, other drawings can be obtained by those of ordinary skill in the art without creative efforts.

DETAILED DESCRIPTION

Figure 1:
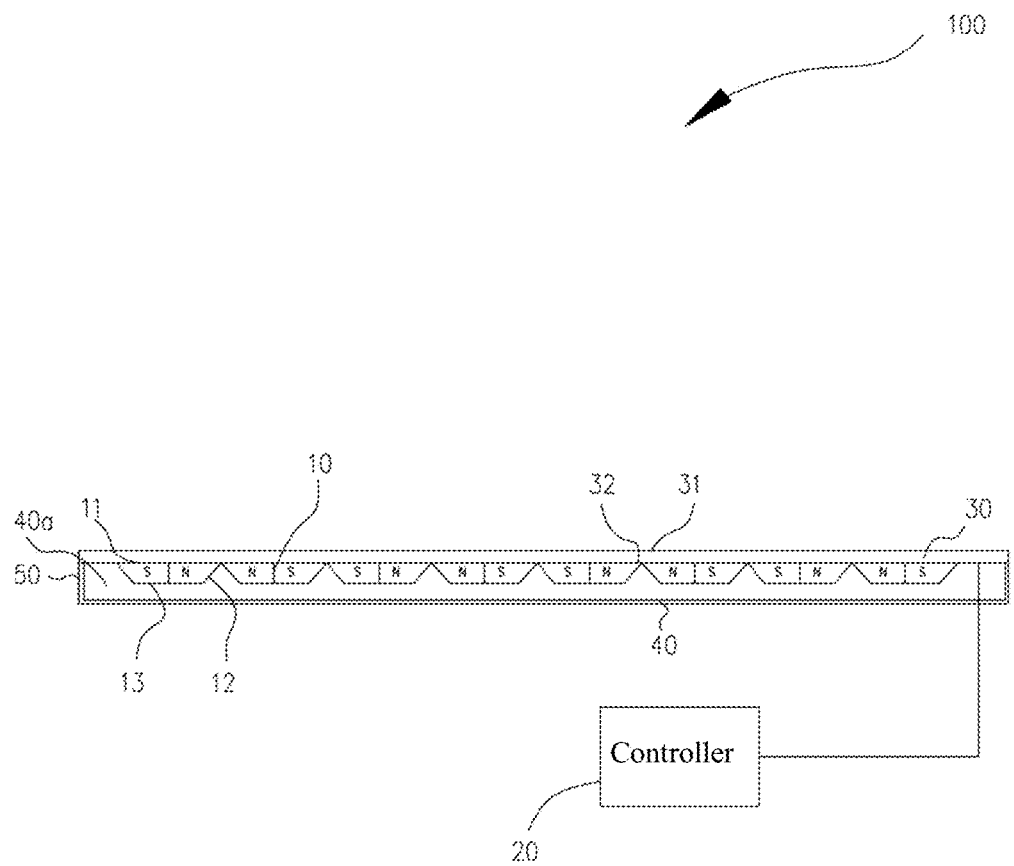
FIG. 1 illustrates a schematic view of a support structure for supporting a flexible display screen according to an embodiment of the present disclosure.

Technical solutions in embodiments of the present disclosure will be described clearly and completely with reference to the drawings.

The present disclosure relates to a support structure for supporting a flexible display screen. The support structure includes a plurality of electromagnets and a controller electrically coupled with the plurality of electromagnets.

Each electromagnet has a first surface and a second surface. The first surface is configured to be attached and secured to the flexible display screen so as to support the flexible display screen, and the second surface is at an acute angle to the first surface. When the support structure is expanded, the controller is configured to control second surfaces of two adjacent electromagnets to be mutually repelled; when the support structure is bent, the controller is configured to control second surfaces of two adjacent electromagnets to be mutually attracted.

The present disclosure relates to a flexible display screen module. The flexible display screen module includes a flexible display screen, a flexible panel, a plurality of electromagnets and a controller. The flexible panel has an outer surface and an inner surface arranged oppositely, and the flexible display screen is attached to the outer surface. The plurality of electromagnets are secured to the inner surface, each electromagnet has a side surface, and side surfaces of two adjacent electromagnets defining a clearance therebetween. The controller is electrically coupled with the plurality of electromagnets, when the flexible display screen is expanded, the controller is configured to control side surfaces of two adjacent electromagnets to be mutually repelled; when the flexible display screen is bent, the controller is configured to control side surfaces of two adjacent electromagnets to be mutually attracted.

The present disclosure relates to another flexible display screen module. The flexible display screen module includes a flexible display screen, a plurality of electromagnets, and a controller. The plurality of electromagnets are secured to the flexible display screen, each electromagnet has a first magnetic pole and a second magnetic pole arranged side by side on the flexible display screen.

The controller electrically is coupled with the plurality of electromagnets, when the flexible display screen is expanded, the controller is configured to control the first magnetic pole of one electromagnet to approach to the first magnetic pole of another adjacent electromagnet, or to control the second magnetic pole of one electromagnet to approach to the second magnetic pole of another adjacent electromagnet; when the flexible display screen is bent, the controller is configured to control the first magnetic pole of one electromagnet to approach to the second magnetic pole of another adjacent electromagnet, or to control the second magnetic pole of one electromagnet to approach to the first magnetic pole of another adjacent electromagnet.

Figure 2:
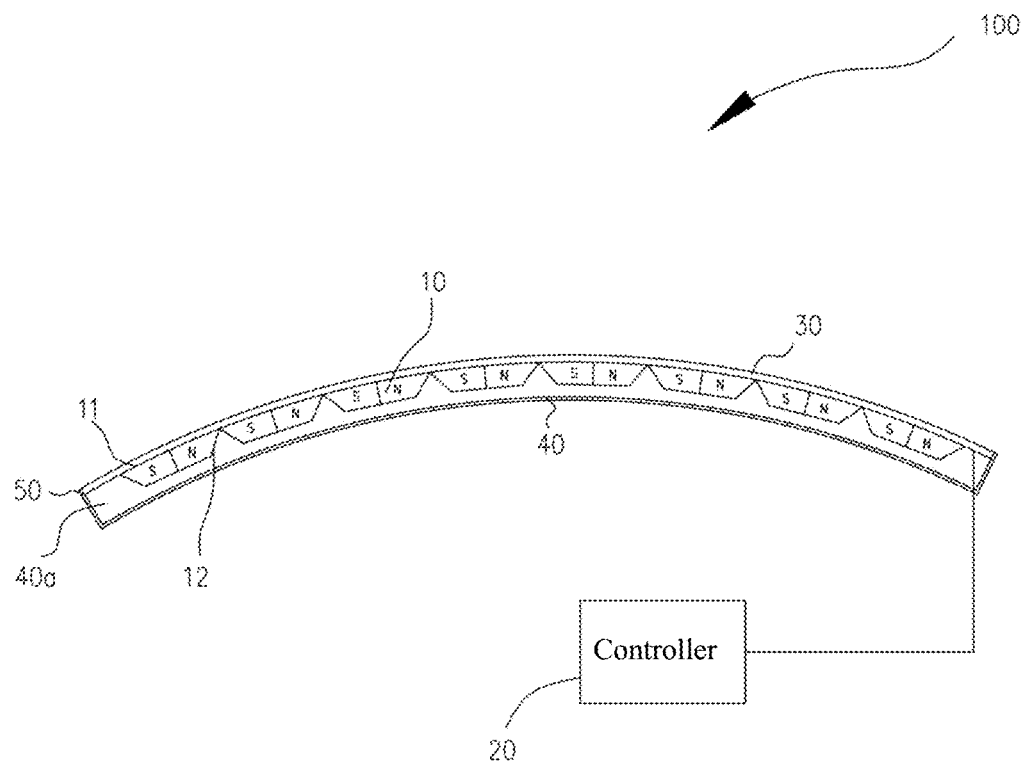
FIG. 2 illustrates a bent state of the support structure of FIG. 1.

As illustrated in FIGS. 1 and 2, a support structure 100 for supporting a flexible display screen 1 provided by the present disclosure includes a plurality of electromagnets 10 and a controller 20 electrically coupled with the plurality of electromagnets 10. The plurality of electromagnets 10 are configured to be secured to a flexible display screen 1. Each electromagnet 10 has a top surface 11 and a side surface 12, the top surface 11 is secured to the flexible display screen 1 so as to support the flexible display screen 1, and the side surface 12 is at an acute angle to the top surface 11. Each electromagnet 10 has a first magnetic pole S and a second magnetic pole N arranged side by side on the flexible display screen 1. When the flexible display screen 1 is expanded, the controller 20 controls the first magnetic pole S of one electromagnet 10 to approach to the first magnetic pole S of another adjacent electromagnet 10, or controls the second magnetic pole N of one electromagnet 10 to approach to the second magnetic pole N of another adjacent electromagnet 10, such that the side surfaces 12 of the two adjacent electromagnets 10 are mutually repelled under the action of identical magnetic poles. When the flexible display screen 1 is bent, the controller 20 controls the first magnetic pole S of one electromagnet 10 to approach to the second magnetic pole N of another adjacent electromagnet 10, or controls the second magnetic pole N of one electromagnet 10 to approach to the first magnetic pole S of another adjacent electromagnet 10, such that the side surfaces 12 of the two adjacent electromagnets 10 are mutually attracted under the action of opposite magnetic poles.

It could be understood that the support structure 100 is applied to a mobile terminal; the controller 20 can control the side surface 12 of the electromagnet 10 at a predetermined position to repel the side surface 12 of the adjacent electromagnet 10, thereby supporting the flexible display screen 1, and may also control the side surface 12 of the electromagnet 10 at the predetermined position to attract the side surface 12 of the adjacent electromagnet 10, thereby enabling the electromagnets 10 to drive the flexible display screen 1 to bend. The mobile terminal can be a mobile phone, a tablet computer, a notebook computer or the like.

Since the flexible display screen 1 is densely provided with the plurality of electromagnets 10, and each electromagnet 10 has the first magnetic pole S and the second magnetic pole N arranged side by side on the flexible display screen 1, by means of the electromagnets 10, the controller 20 controls the first magnetic pole S of one electromagnet 10 to approach to the first magnetic pole S of another adjacent electromagnet 10, such that the side surfaces 12 of the two adjacent electromagnets 10 are mutually repelled under the action of a repulsive force of identical magnetic poles, and hence are expanded, in which case the plurality of electromagnets 10 drive the flexible display screen 1 to expand and support the flexible display screen 1; the controller 20 controls the first magnetic pole S of one electromagnet 10 to approach to the second magnetic pole N of another adjacent electromagnet 10, such that the side surfaces 12 of the two adjacent electromagnets 10 are attached to each other under the action of an attractive force of opposite magnetic poles, and drive the flexible display screen 1 to be rolled up tightly together, thereby facilitating the rolling of the flexible display screen 1. The support structure 100 can support the flexible display screen 1 when the flexible display screen 1 is expanded, and can facilitate the tight rolling and collapse of the flexible display screen 1 when the flexible display screen 1 is rolled up, thereby improving user experience.

In this embodiment, the electromagnet 10 is tapered. As a possible implementation, the electromagnet 10 is a frustum of square pyramid, and the electromagnet 10 has a square cross section perpendicular to a height direction. It should be noted that, the height direction of each electromagnet 40 refers to a direction perpendicular to the respective top surface 41 of the electromagnet 40. The plurality of electromagnets 10 can be closely arranged to the flexible display screen 1. Each electromagnet 10 has the first magnetic pole S and the second magnetic pole N arranged side by side on the flexible display screen 1. The first magnetic pole S and the second magnetic pole N of each electromagnet 10 can be arranged side by side along a length direction of the flexible display screen 1, that is, each the electromagnet 10 is divided into two parts—the first magnetic pole S and the second magnetic pole N—in the length direction of the flexible display screen 1. In a possible situation, along the length direction of the flexible display screen 1, the first magnetic pole S of one electromagnet 10 may be coupled with the first magnetic pole S of another adjacent electromagnet 10, and naturally, the second magnetic pole N of the one electromagnet 10 is coupled with the second magnetic pole N of another adjacent electromagnet 10. Since respective top surfaces 11 of the two adjacent electromagnets 10 are closely coupled, when the flexible display screen 1 is in an expanded state, height directions of the two adjacent electromagnets 10 are parallel to each other, so that there is a clearance between the side surfaces 12 of the two adjacent electromagnets 10. The side surfaces 12 of the two adjacent electromagnets 10 are mutually repelled by the repulsive force of the two first magnetic poles S or the two second magnetic poles N, such that the clearance remains present between the side surfaces 12 of the two electromagnets 10, and the top surfaces 11 of the two adjacent electromagnets 10 can be flush with each other, thereby supporting the flexible display screen 1. In another situation, along the length direction of the flexible display screen 1, the controller 20 exchanges positions of the first magnetic pole S and the second magnetic pole N of the electromagnet 10 in the predetermined position, such that the first magnetic pole S of the one electromagnet 10 is coupled with the second magnetic pole N of another adjacent electromagnet 10. Since the top surfaces 11 of the two adjacent electromagnets 10 are closely coupled, when the flexible display screen 1 is in a bent state, the height directions of the two adjacent electromagnets 10 are at an angle to each other, so that the side surfaces 12 of the two adjacent electromagnets 10 approach to each other, and thus are attached to each other. The side surfaces 12 of the two adjacent electromagnets 10 are mutually attracted by the attractive force between the first magnetic pole S and the second magnetic pole N, that is, the side surfaces 12 of the two adjacent electromagnets 10 are attached to each other by a magnetic attraction force, such that the top surfaces 11 of the two adjacent electromagnets 10 are at an angle to each other, thereby driving the flexible display screen 1 to bend and enabling the flexible display screen 1 to keep the bent state. It could be understood that the predetermined position can be any position in the length direction of the flexible display screen 1, that is, a user may bend the flexible display screen 1 at any position in the length direction thereof. Since the first magnetic pole S and the second magnetic pole N of each electromagnet 10 can be arranged side by side along the length direction of the flexible display screen 1, the flexible display screen 1 can be bent or expanded in the length direction. In other embodiments, the electromagnet 10 may also be a frustum of hexagonal pyramid or a conical frustum or the like. The first magnetic pole S and the second magnetic pole N of each electromagnet 10 can be arranged side by side along a width direction of the flexible display screen 1, that is, the flexible display screen 1 can be bent or expanded in the width direction. Certainly, in other embodiments, the electromagnet 10 may also be a combination of a rectangular block and a tapered block, the top surface 11 of the electromagnet 10 is provided to the rectangular block, while the side surface 12 is provided to the tapered block, and there may also be a clearance between the top surfaces 11 of the two adjacent electromagnets 10.

In this embodiment, the controller 20 can be a central processor. The controller 20 can simultaneously send an electrical signal to the plurality of electromagnets 10 to exchange the positions of magnetic poles of the plurality of electromagnets 10, so that the flexible display screen 1 can be integrally bent. The controller 20 can also send an electrical signal to a part of the electromagnets 10 to exchange the positions of magnetic poles of the part of the electromagnets 10, such that the flexible display screen 1 can be partially bent. Certainly, in other embodiments, the controller 20 may also be independent of a central processor of the mobile terminal, thereby improving control efficiency of the support structure 100.

Further, the support structure 100 also includes a flexible panel 30 attached to the flexible display screen 1, and the plurality of electromagnets 10 are densely arranged to a side of the flexible panel 30 away from the flexible display screen 1.

In this embodiment, the flexible panel 30 is a rectangular board. The flexible panel 30 exhibits flexibility, and can be bent freely under an external force. The flexible panel 30 includes an outer surface 31 and an inner surface 32 arranged oppositely. When the support structure 100 is applied to the mobile terminal, the outer surface 31 is attached to the flexible display screen 1. The inner surface 32 is densely provided with the plurality of electromagnets 10. The plurality of electromagnets 10 can be bonded to, snapped with, embedded in, or integrally provided to the inner surface 32. The plurality of electromagnets 10 are separated from the flexible display screen 1 by means of the flexible panel 30, thereby protecting the flexible display screen 1, preventing the electromagnets 10 from damaging the flexible display screen 1, and also preventing the electromagnets 10 from being detached from the flexible display screen 1. By attaching the plurality of electromagnets 10 to the flexible panel 30, the stability of the support structure 100 is enhanced. Certainly, in other embodiments, the flexible panel 30 may be circular or in other polygonal shapes.

Further, the plurality of electromagnets 10 are arranged in an array on the flexible panel 30. In the present embodiment, the plurality of electromagnets 10 are longitudinally arranged along a length direction of the flexible panel 30, and are transversely arranged along a width direction of the flexible panel 30. The flexible panel 30 can be bent along the length direction, such that the side surfaces 12 of the plurality of electromagnets 10 arranged longitudinally approach to each other, thereby causing the flexible display screen 1 to be bent along the length direction. In other embodiments, the flexible panel 30 can be bent along the width direction, such that the side surfaces 12 of the plurality of electromagnets 10 in the width direction approach to each other, thereby causing the flexible display screen 1 to be bent along the width direction.

Further, the flexible panel 30 is an elastic memory board. It can be understood that when the flexible panel 30 is in a bent state, the controller 20 controls the electromagnets 10 to be de-energized, that is, the magnetic attraction force between the two adjacent electromagnets 10 is revoked. After the magnetic attraction force is revoked, a force imposed on the flexible panel 30 by the electromagnets 10 is eliminated, the flexible panel 30 changes its own molecular chain from a bent state to a stretched state by self-intermolecular stress, such that the flexible panel 30 is allowed to return to the expanded state, and can drive the flexible display screen 1 to be restored to the expanded state automatically. In other embodiments, the flexible panel may also be made of an elastic material such as high elastic rubber or high elastic carbon fiber.

Further, the support structure 100 further includes a flexible back board 40 and a side board 50; the flexible back board 40 is arranged opposite to the flexible panel 30 and defines a gap 40a together with the flexible panel 30; the plurality of electromagnets 10 are located in the gap 40a; the side board 50 encloses outer peripheral sides of the flexible panel 30 and the flexible back board 40, and seals the gap 40a.

In this embodiment, the flexible back board 40 is a rectangular board. The flexible back board 40 has the same size as the flexible panel 30. There is a clearance between the flexible back board 40 and the electromagnets 10, so that an airflow channel is defined between the flexible back board 40 and the electromagnets 10, and hence it is convenient for an airflow between the side surfaces 12 of the two adjacent electromagnets 10 to flow smoothly when the support structure 100 is bent, thereby allowing the side surfaces 12 of the two adjacent electromagnets 10 to approach to each other. The flexible back board 40 and the flexible panel 30 are bent together to facilitate the protection of the electromagnets 10. The flexible back board 40 and the flexible panel 30 can be made of the same material.

In this embodiment, the side board 50 is bonded to peripheral sides of the flexible panel 30 and the flexible back board 40. The side board 50 may be a flexible film, and the side board 50 has relatively good ductility. When the flexible display screen 1 needs to be rolled up, the flexible panel 30 and the flexible back board 40 are bent and hence the flexible panel 30 and the flexible back board 40 are displaced, resulting in deformation of the side board 50, such that the side board 50 enhances the deformation performance of the support structure 100. In addition, the side surfaces 12 of the plurality of electromagnets 10 approach to each other, so that the air between the two adjacent electromagnets 10 is squeezed, and with relatively good deformation performance of the side board 50, the squeezed air can flow to the side board 50 to cause the side board 50 to bulge. The flexible panel 30, the flexible back board 40 and the side board 50 together constitute an accommodating body, and the gap 40a constitutes an inner cavity of the accommodating body, such that the plurality of electromagnets 10 are accommodated within the accommodating body and thus are protected. In other embodiments, the side board is made of high elastic rubber or a high elastic carbon fiber material.

Figure 3:
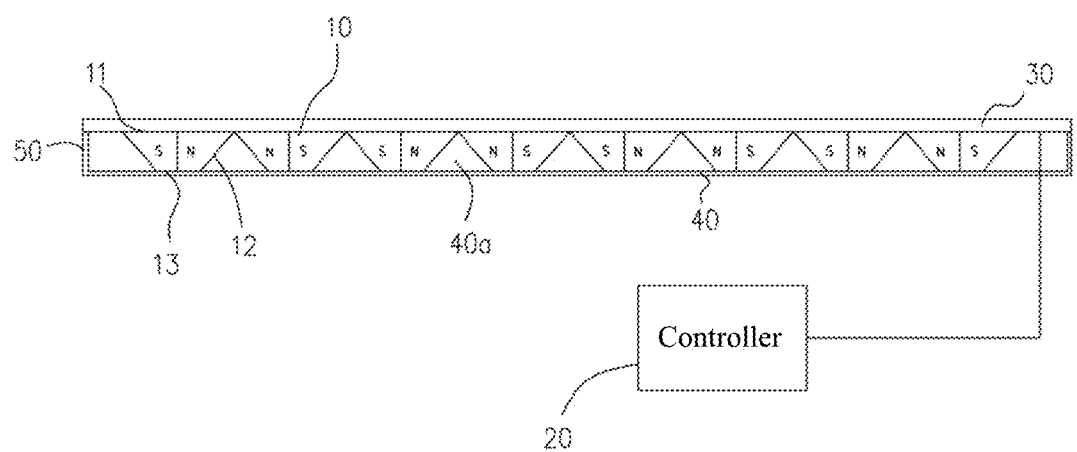
FIG. 3 illustrates a schematic view of a support structure for supporting a flexible display screen according to another embodiment of the present disclosure.
Figure 4:
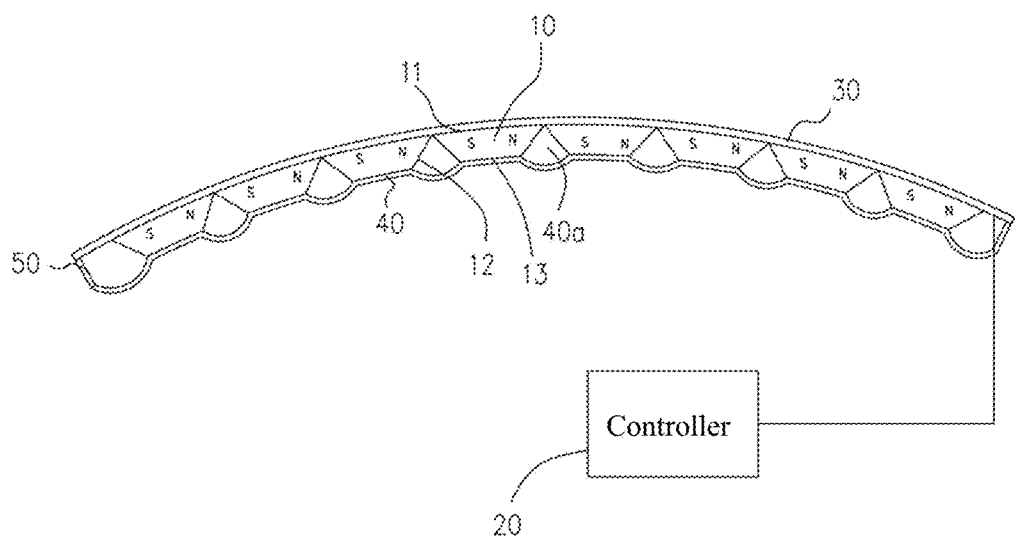
FIG. 4 illustrates a bent state of the support structure of FIG. 3.

Further, as illustrated in FIGS. 3 and 4, another embodiment is provided. Different from the above embodiment, each electromagnet 10 has a bottom surface 13 opposite to the top surface 11, and the bottom surface 13 is attached to the flexible back board 40. Specifically, in order to make the support structure 100 more stable, the bottom surface 13 of the electromagnet 10 is attached to the flexible back board 40, which prevents the flexible back board 40 from detaching from the electromagnets 10 and prevents impurities from entering between the two adjacent electromagnets 10. Moreover, by attaching the bottom surface 13 of the electromagnet 10 to the flexible back board 40, an area of the flexible back board 40 between two adjacent electromagnets 10 forms a deformable channel. When the flexible panel 30 and the flexible back board 40 are rolled up together, the air between the two adjacent electromagnets 10 can be squeezed to the deformable channel of the flexible back board 40 between the two adjacent electromagnets 10, thereby causing the area to bulge. In such a way, the squeezed air can be accommodated, and the support structure 100 can be prevented from damages.

Further, as illustrated in FIGS. 1 and 2, in at least one embodiment, the plurality of electromagnets 10 are coupled via a conductive cable. In the present embodiment, in order to energize the plurality of electromagnets 10 conveniently at the same time, the plurality of electromagnets 10 are coupled in series by using the conductive cable. Specifically, the conductive cable can include a plurality of transverse wires and a plurality of longitudinal wires, each transverse wire is provided with a positive node while each longitudinal wire is provided with a negative node, and each positive node and each negative node are correspondingly coupled to the electromagnet 10. Each transverse wire is serially coupled to the plurality of electromagnets 10 arranged transversely, and each longitudinal wire is serially coupled to the plurality of electromagnets 10 arranged longitudinally. Thus, when the transverse wires and the longitudinal wires are energized, each electromagnet 10 receives a voltage and hence exhibits magnetic properties. Moreover, the plurality of electromagnets 10 are electrically coupled with the controller 20 via the conductive cable, so that the controller 20 controls the position exchange of magnetic poles of the electromagnet 10 at the predetermined position.

Figure 5:
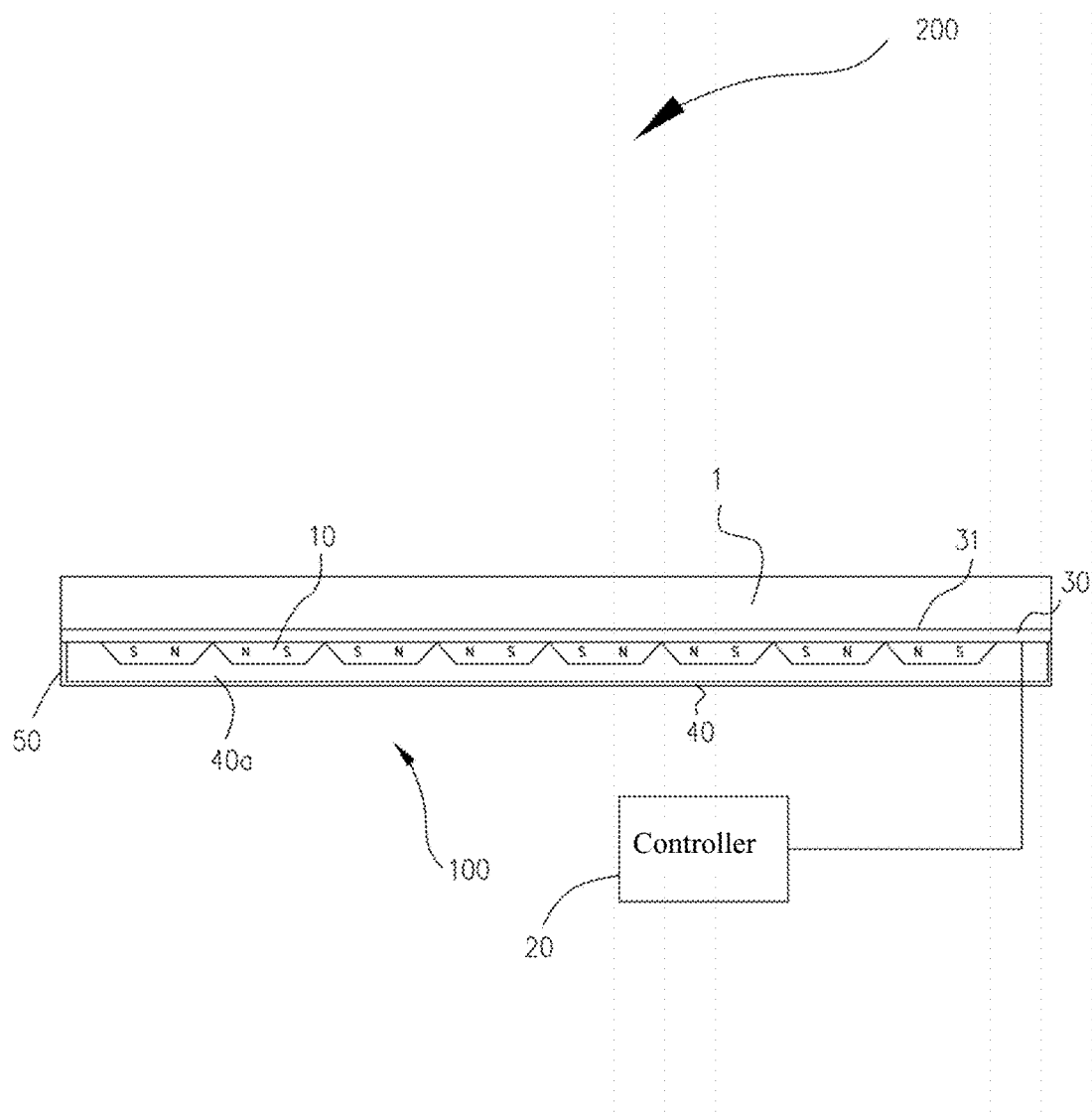
FIG. 5 illustrates a schematic view of a flexible display screen module according to the present disclosure.
Figure 6:
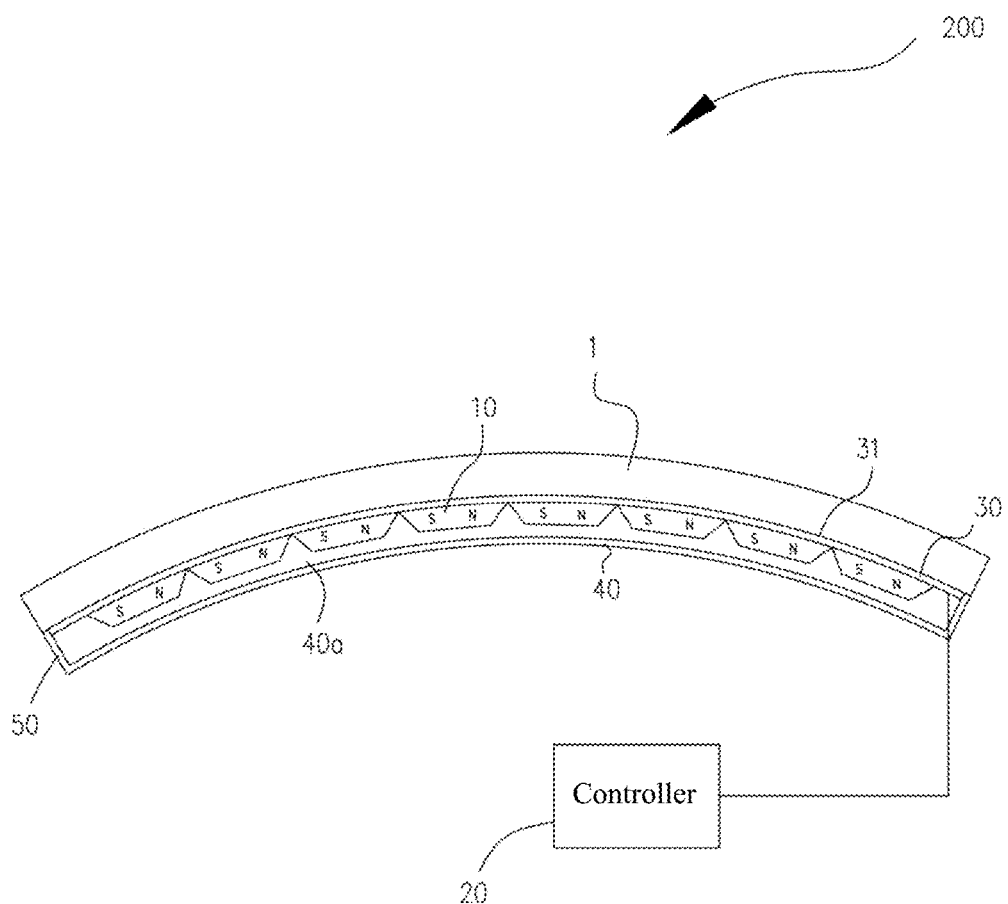
FIG. 6 illustrates a bent state of the flexible display screen module of FIG. 5.

As illustrated in FIGS. 5 and 6, the present disclosure further provides a flexible display screen module 200. The flexible display screen module 200 includes the support structure 100, and the flexible display screen module 200 also includes the flexible display screen 1. The flexible display screen 1 is attached to a side of the flexible panel 30 facing away from the flexible back board 40. In this embodiment, the flexible display screen 1 is an organic electroluminescent display layer, and the flexible display screen 1 is stacked on the support structure 100. Specifically, the flexible display screen 1 can be stacked on the outer surface 31 of the flexible panel 30, and be bonded to the outer surface 31 by glue.

Figure 7:
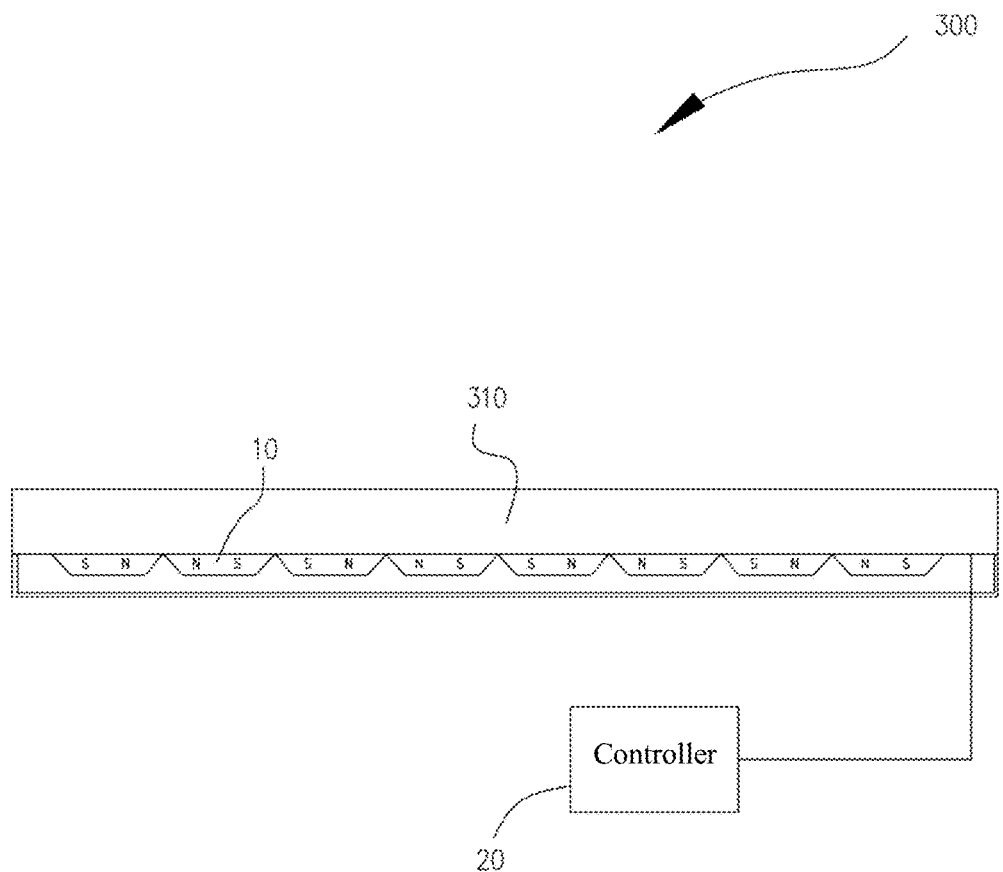
FIG. 7 illustrates a schematic view of another flexible display screen module according to the present disclosure.
Figure 8:
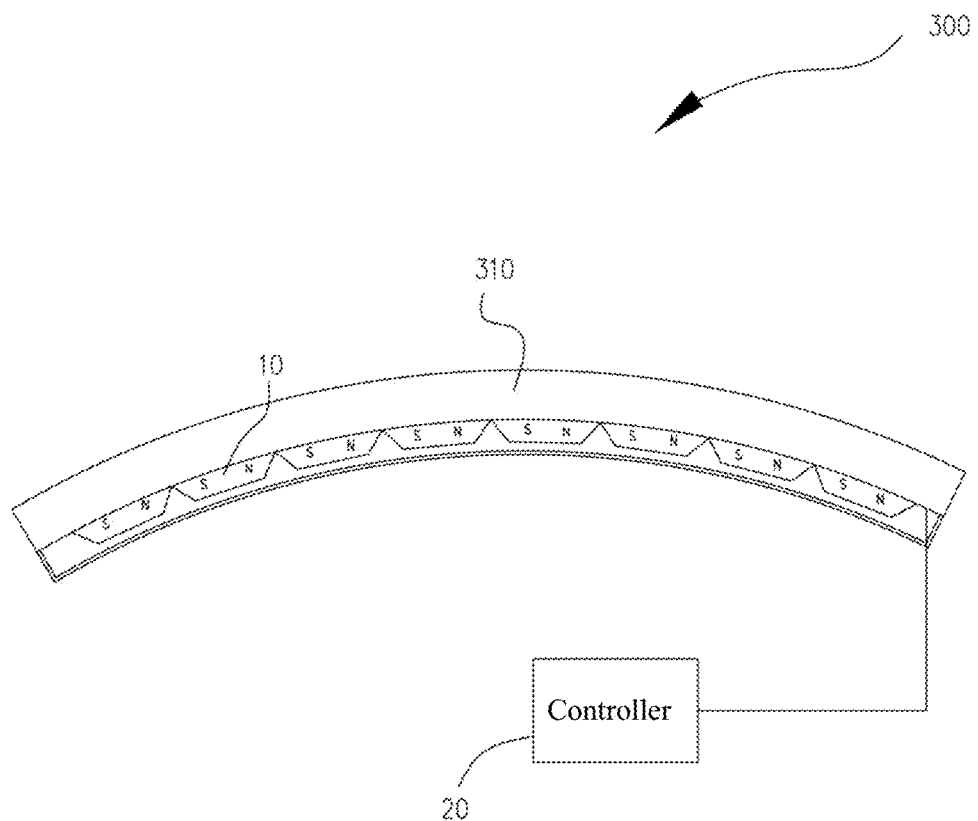
FIG. 8 illustrates a bent state of the flexible display screen module of FIG. 7.

As illustrated in FIGS. 7 and 8, the present disclosure further provides another flexible display screen module 300. The flexible display screen module 300 includes a flexible display screen 310, and the flexible display screen 310 is attached to the plurality of electromagnets 10 arranged densely.

Figure 9:
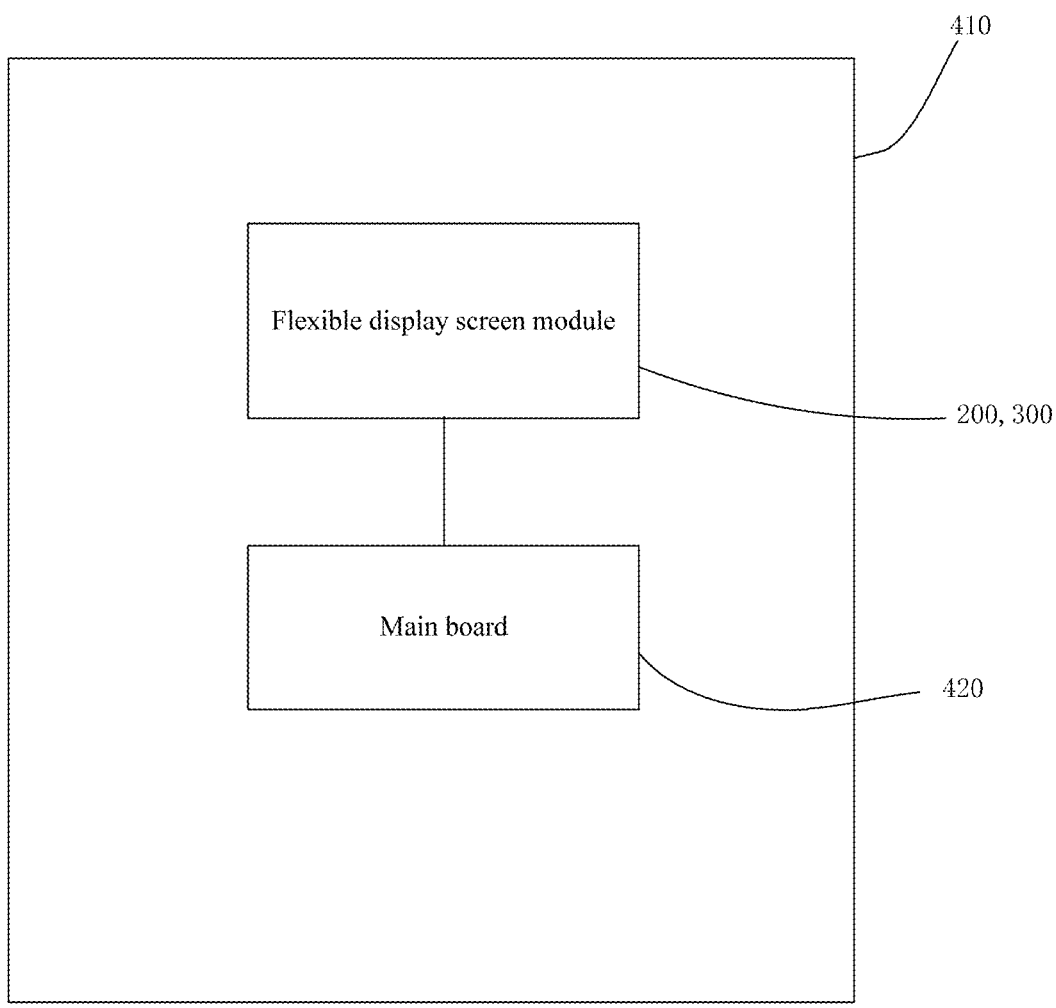
FIG. 9 illustrates a schematic view of a mobile terminal according to the present disclosure.

As illustrated in FIG. 9, the present disclosure further provides a mobile terminal 400. The mobile terminal 400 includes the flexible display screen module 200 or 300. The mobile terminal 400 also includes a housing 410, and a main board 420 secured in the housing. The flexible display screen module 200 or 300 is secured to the housing 410 and electrically coupled with the main board 420. The mobile terminal 400 can be a mobile phone, a tablet computer, a notebook computer or the like.

For the support structure, the flexible display screen module, and the mobile terminal according to the present disclosure, since the flexible display screen is densely provided with the plurality of electromagnets, and each electromagnet has the first magnetic pole and the second magnetic pole arranged side by side on the flexible display screen, by means of the electromagnets in the conical or pyramidal frustum shape, the controller controls the first magnetic pole of one electromagnet to approach to the first magnetic pole of another adjacent electromagnet, such that the side surfaces of the two adjacent electromagnets are mutually repelled under the action of a repulsive force of identical magnetic poles, and hence are expanded, in which case the plurality of electromagnets drive the flexible display screen to expand and support the flexible display screen; the controller controls the first magnetic pole of one electromagnet to approach to the second magnetic pole of another adjacent electromagnet, such that the side surfaces of the two adjacent electromagnets are attached to each other under the action of an attractive force of opposite magnetic poles, and drive the flexible display screen to be rolled up tightly together, thereby facilitating the rolling of the flexible display screen. The support structure can support the flexible display screen when the flexible display screen is expanded, and can facilitate the tight rolling and collapse of the flexible display screen when the flexible display screen is rolled up, thereby improving the user experience.

The above are some embodiments of the present disclosure. It should be noted that those skilled in the art can make improvements and modifications without departing from the principles of the present disclosure, and these improvements and modifications are also within the protection scope of the present disclosure.

What is claimed is:

1. A support structure for supporting a flexible display screen, comprising:
   a plurality of electromagnets, each electromagnet having a first surface and a second surface, the first surface being configured to be attached and secured to the flexible display screen so as to support the flexible display screen, and the second surface being at an acute angle to the first surface;
   a controller electrically coupled with the plurality of electromagnets, when the support structure is expanded, the controller being configured to control second surfaces of two adjacent electromagnets to be mutually repelled; when the support structure is bent, the controller being configured to control second surfaces of two adjacent electromagnets to be mutually attracted;
   a flexible panel, the plurality of electromagnets being secured to the flexible panel;
   a flexible back board, the flexible back board being arranged opposite to the flexible panel and defining a gap together with the flexible panel, and the plurality of electromagnets being located in the gap; and
   a side board, the side board enclosing outer peripheral sides of the flexible panel and the flexible back board, and the side board sealing the gap.

2. The support structure according to claim 1, wherein the electromagnet is tapered.

3. The support structure according to claim 1, wherein each electromagnet has a first magnetic pole and a second magnetic pole arranged side by side on the flexible display screen.

4. The support structure according to claim 3, wherein the first magnetic pole and the second magnetic pole of each electromagnet are arranged side by side along a length direction of the flexible display screen.

5. The support structure according to claim 1, wherein the flexible panel is configured to be attached to the flexible display screen.

6. The support structure according to claim 1, wherein the plurality of electromagnets are arranged in an array on the flexible panel.

7. The support structure according to claim 1, wherein the flexible panel is an elastic memory board.

8. The support structure according to claim 1, wherein the side board is a flexible board.

9. The support structure according to claim 1, wherein a clearance is defined between the flexible back board and the electromagnet, and the clearance forms an airflow channel.

10. The support structure according to claim 1, wherein each electromagnet further has a third surface arranged opposite to the first surface, and the third surface is attached to the flexible back board.

11. A flexible display screen module, comprising:
    a flexible display screen;
    a flexible panel having an outer surface and an inner surface arranged oppositely, the flexible display screen being attached to the outer surface;
    a plurality of electromagnets secured to the inner surface, each electromagnet having a side surface, side surfaces of two adjacent electromagnets defining a clearance therebetween;
    a controller electrically coupled with the plurality of electromagnets, when the flexible display screen is expanded, the controller being configured to control side surfaces of two adjacent electromagnets to be mutually repelled; when the flexible display screen is bent, the controller being configured to control side surfaces of two adjacent electromagnets to be mutually attracted;
    a flexible back board spaced apart from the flexible panel, the inner surface being oriented towards the flexible back board; and
    a side board enclosing outer peripheral sides of the flexible panel and the flexible back board to cooperatively define a cavity with the flexible panel and the flexible back board, the plurality of electromagnets being located in the cavity.

12. The flexible display screen module according to claim 11, wherein each electromagnet has a top surface configured to support the flexible display screen, the top surface is attached to the inner surface, and top surfaces of two adjacent electromagnets are closely coupled.

13. The flexible display screen module according to claim 12, wherein the side surface is at an acute angle to the top surface for each electromagnet.

14. The flexible display screen module according to claim 12, the flexible panel is a rectangular board, the flexible back board is a rectangular board, and the flexible back board has the same size as the flexible panel.

15. A flexible display screen module, comprising:
    a flexible display screen;
    a plurality of electromagnets secured to the flexible display screen, each electromagnet having a first magnetic pole and a second magnetic pole arranged side by side on the flexible display screen;
    a controller electrically coupled with the plurality of electromagnets, when the flexible display screen is expanded, the controller being configured to control the first magnetic pole of one electromagnet to approach to the first magnetic pole of another adjacent electromagnet, or to control the second magnetic pole of one electromagnet to approach to the second magnetic pole of another adjacent electromagnet; when the flexible display screen is bent, the controller being configured to control the first magnetic pole of one electromagnet to approach to the second magnetic pole of another adjacent electromagnet, or to control the second magnetic pole of one electromagnet to approach the first magnetic pole of another adjacent electromagnet; and
    a flexible back hoard and a side board, the flexible back board is arranged opposite to a flexible panel and defines a gap together with the flexible panel, and the plurality of electromagnets are located in the gap, and the side hoard encloses outer peripheral sides of the flexible panel and the flexible back board and seals the gap.

16. The flexible display screen module according to claim 15, wherein the flexible display screen is an organic electroluminescent display layer.

* * * * *